United States Patent [19]

Nariani et al.

[11] Patent Number: 5,374,833
[45] Date of Patent: Dec. 20, 1994

[54] STRUCTURE FOR SUPPRESSION OF FIELD INVERSION CAUSED BY CHARGE BUILD-UP IN THE DIELECTRIC

[75] Inventors: Subhash R. Nariani, San Jose; Vivek Jain, Milpitas; Dipankar Pramanik, Cupertino; Kuang-Yeh Chang, Los Gatos, all of Calif.

[73] Assignee: VLSI Technology, Inc., San Jose, Calif.

[21] Appl. No.: 775,085

[22] Filed: Oct. 11, 1991

Related U.S. Application Data

[63] Continuation-in-part of Ser. No. 476,089, Mar. 5, 1990, Pat. No.

[51] Int. Cl.$^5$ .............................................. H02L 45/00
[52] U.S. Cl. ....................................... 257/52; 257/409; 257/499; 257/646
[58] Field of Search ................. 257/52, 402, 405, 406, 257/407, 409, 410, 411, 412, 57, 488, 489, 499, 646

[56] References Cited

U.S. PATENT DOCUMENTS

| | | | |
|---|---|---|---|
| 3,649,884 | 3/1972 | Haneta | 257/325 |
| 4,123,565 | 10/1978 | Sumitomo et al. | 427/88 |
| 4,375,125 | 3/1983 | Byatt | 29/588 |
| 4,502,202 | 3/1985 | Malhi | 29/571 |
| 4,555,300 | 11/1985 | Arnold | 156/613 |
| 4,613,888 | 9/1986 | Mase et al. | 357/54 |
| 4,688,078 | 8/1987 | Hseih | 257/325 |
| 4,732,801 | 3/1988 | Joshi | 428/198 |
| 4,810,673 | 3/1989 | Freeman | 437/239 |
| 4,972,250 | 11/1990 | Omori et al. | 357/54 |
| 4,996,167 | 2/1991 | Chen | 437/40 |
| 5,047,826 | 10/1991 | Keller et al. | 357/42 |
| 5,057,897 | 10/1991 | Nariani et al. | 357/54 |
| 5,110,766 | 5/1992 | Maeda et al. | 437/228 |
| 5,128,279 | 7/1992 | Nariani et al. | 437/195 |
| 5,290,727 | 3/1994 | Jain et al. | 437/238 |

OTHER PUBLICATIONS

D. Pramanik, S. R. Nariani and G. Spadini, "Field Inversion In CMOS Double Metal Circuits Due to Carbon Based SOG's", VMIC Conference, Jun. 12-13, 1989, pp. 454-462.

"Suppression of Hot-Carrier Effects in submicrometer CMOS Technology", by Chen, Min-Liang et al, IEEE Transactions on Electron Devices, vol. 35, No. 12, Dec. 1988, pp. 2210-2220, cited in specification p. 2.

"Mobile Charge in a Novel Spin-On Oxide (SOX) Detection of Hydrogen in Dielectrics", by N. Lifshitz et al, Journal Electrochem. Soc., vol. 136, No. 5, May 1989, pp. 1440-1446, cited on specification p. 3.

"Hot-Carrier Aging of the MOS Transistor in the Presence of Spin-on Glass as the Interlevel Dielectric", by N. Lifshitz et al, IEEE Electron Device Letters, vol. 12, No. 3, Mar. 1991, pp. 140-142, cited on specification p. 3.

"Charge Loss in EPROM Due to Ion Generation and Transport in Interlevel Dielectric", by G. Crisenza et al, Proceedings of IEEE IEDM, 1990, pp. 107-110, cited on specification p. 3.

"Electroluminescence Studies in Silicon Dioxide Films Containing Tiny Silicon Islands", by D. J. DiMaria et al, Journal of Appl. Phys., vol. 56, Jul. 1984, pp. 401-416, cited on specification p. 1.

"Improvement Of Endurance to Hot Carrier Degradation", Yoshida et al., *IEEE*, 1988, pp. 22-25.

*Primary Examiner*—Sara W. Crane
*Attorney, Agent, or Firm*—Burns, Doane, Swecker & Mathis

[57] ABSTRACT

The invention relates to an integrated circuit including one or more amorphous silicon layers for neutralizing charges which occur in various dielectric layers during fabrication. The amorphous silicon layers include dangling silicon bonds which neutralize charges which would otherwise cause isolation breakdown, impair integrated circuit performance and increase manufacturing costs.

17 Claims, 1 Drawing Sheet

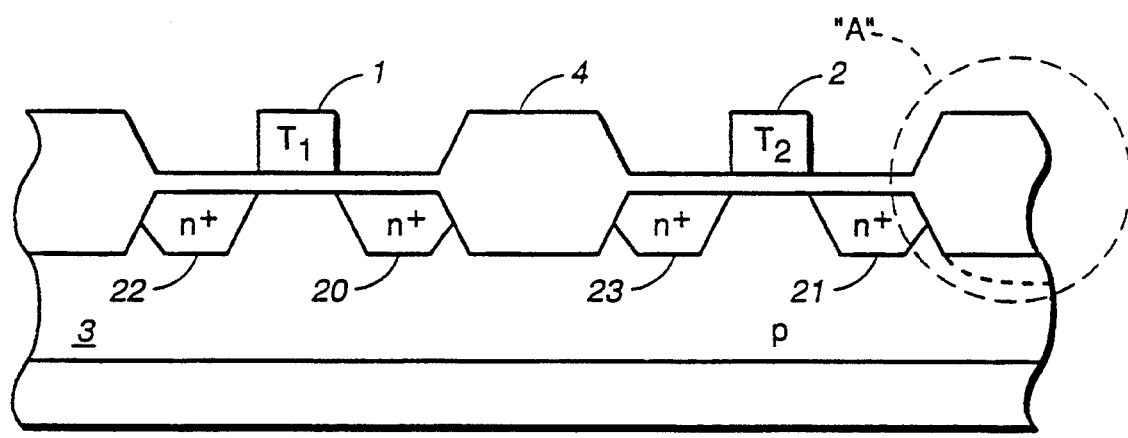
FIG._1
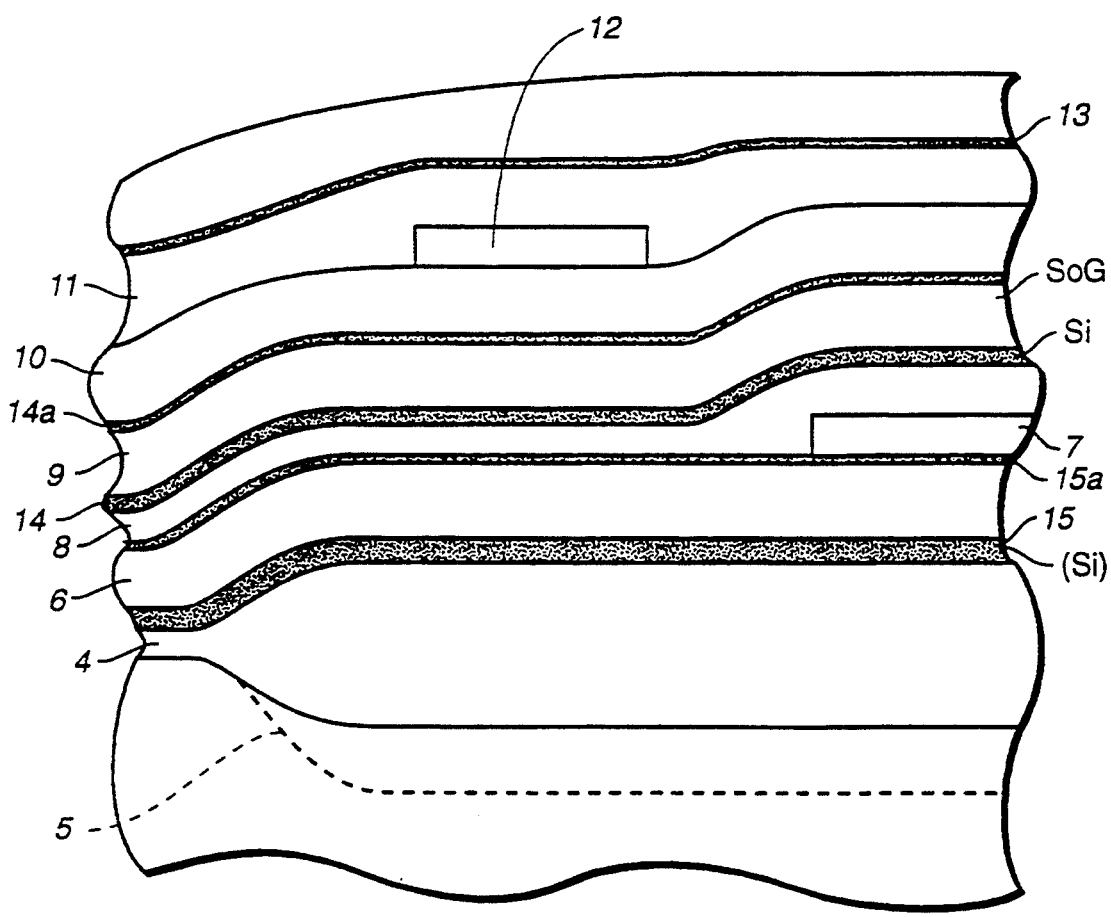
FIG._2

STRUCTURE FOR SUPPRESSION OF FIELD INVERSION CAUSED BY CHARGE BUILD-UP IN THE DIELECTRIC

BACKGROUND OF THE INVENTION

The present application is a continuation-in-part application of U.S. patent application Ser. No. 07/476,089, filed on Mar. 5, 1990 now U.S. Pat. No. 5,057,897.

FIELD OF THE INVENTION

The present invention relates generally to integrated circuits and multilayer structures for fabricating integrated circuits. More particularly, the invention relates to particular multilayer structures and methods of fabricating multilayer structures to suppress channel field inversion of isolation implants between transistors in integrated circuits (ICs).

STATE OF THE ART

Typically, integrated circuits comprise a large number of devices (e.g., transistors) fabricated on a silicon substrate that are electrically isolated from one another using, for example, a field oxide layer. Electrical isolation of the transistors is typically achieved by first doping a silicon substrate channel between transistors to impede carriers from moving through the channel. Thus if the transistors are n-type, the isolation channel is doped with a p-type dopant such as boron. Oxide layers are also generated between transistors to insulate the doped isolation channel from voltages applied during fabrication, packaging or operation of the integrated circuit.

Typically, transistors are selectively connected by photolithographically patterning metallization layers as metal traces. To permit routing of a metal trace over a multilevel substrate, two or more metallization levels are typically used to form each metal trace. Each metallization level is separated by a dielectric layer to isolate each metallization level and to prevent shorting of traces. Vias may be formed in the dielectric layer to complete traces in different metallization levels. These dielectric layers tend to conform to the surface of the traces thus forming valleys between the traces.

To planarize intermediate layers of the IC during fabrication, the dielectric layer is formed as an intermetal oxide sandwich interposed between each metallization layer. The intermetal oxide sandwich includes a spin-on-glass (SOG) layer which is applied as a liquid to fill in the valleys created by each metallization layer. An outer passivation layer is formed which protects the integrated circuit from ambient conditions such as moisture. This passivation layer may be comprised of a silicon nitride, for example.

The foregoing integrated circuit is susceptible to current leakage between adjacent transistors separated by isolation areas. A threshold voltage is associated with the underlying substrate and the thickness of the oxide layer. When a voltage is applied to the isolation oxide such that its threshold voltage is exceeded, inversion of the channel substrate beneath the oxide layer occurs and carriers travel between adjacent transistors. This effect impairs integrated circuit performance, lowers manufacturing yield and raises costs.

There are many different circumstances wherein a voltage is applied to the oxide layer which causes isolation breakdown. For example, a reaction between the nitride passivation layer and the SOG layer creates a charge that leads to inversion of the isolation channel. During the manufacturing of the IC packages, certain high temperature operations cause hydrogen to be released from the nitride passivation layer. This free hydrogen diffuses downward and reacts with carbon in the organic SOG layer. This reaction results in the formation of a positive charge which is sufficient to cause isolation breakdown. Additionally, there are many fabrication operations wherein charge can be induced in the isolation oxide such that the underlying channel is inverted.

In co-pending, commonly assigned U.S. patent application Ser. No. 07/476,089, filed on Mar. 5, 1990, exemplary solutions to the foregoing isolation breakdown problem are proposed. For example, the intermetal oxide sandwich is modified so that one or both of the oxide layers which sandwich the SOG layer are enriched with silicon. Dangling bonds of the silicon neutralize charge created by the reaction of the hydrogen and carbon, particularly if the enriched layer is below the SOG layer. The silicon-enriched, intermetal oxide layer is created by, among other methods, adding additional silicon-bearing reagent during plasma deposition.

Although the introduction of silicon enriched oxide reduces isolation breakdown due to the reaction between the nitride passivation layer and the SOG layer, it would be desirable to further suppress isolation breakdown caused by other phenomena without altering properties (e.g., step coverage, stress, and etch rates) of the intermetal oxide layers. Also, it would be desirable to simplify manufacturing of the integrated circuit, reduce manufacturing costs, and shield the field oxide layer from voltages or charges introduced into layers other than the SOG layer.

SUMMARY OF THE INVENTION

In accordance with the present invention, a multilayer integrated circuit includes a field oxide layer and substrate channel shielded from voltages introduced into any of the upper layers of the package. This shielding is provided without modifying characteristics of existing layers of the integrated circuit package. This allows an integrated circuit to be manufactured using standard oxide deposition machines and having layers with standard characteristics.

More particularly, the invention relates to an integrated circuit which includes a field oxide layer and substrate channel shielded from isolation breakdown using one or more layers of amorphous silicon located beneath one or more dielectric layers. Further, the invention relates to a method for manufacturing integrated circuits having amorphous silicon layers for neutralizing undesirable charges.

In a preferred embodiment, an amorphous silicon layer is formed beneath an SOG layer of an integrated circuit to neutralize any charge created therein due to the reaction of a nitride passivation layer with carbon in the SOG layer or any other charge generating phenomenon. In an alternate preferred embodiment, another amorphous silicon layer is formed on top of the SOG layer to neutralize charges. In yet another preferred embodiment, an amorphous silicon layer is formed between a Boron Phosphorous Silicate Glass (BPSG) dielectric layer and a field oxide layer.

BRIEF DESCRIPTION OF THE DRAWINGS

These and other advantages and objects of the invention will become more apparent from the following detailed description of preferred embodiments when read in conjunction with the attached Figures in which:

FIG. 1 is a cross-sectional view of a conventional, multilayer integrated circuit; and FIG. 2 is a cross-sectional view of an isolation area "A" of FIG. 1 in an exemplary multilayer integrated circuit according to a preferred embodiment of the invention.

DETAILED DESCRIPTION OF THE PREFERRED EMBODIMENTS

A generalized cross-section of a conventional integrated circuit is illustrated in FIG. 1. Two transistors 1 and 2 are formed on a silicon substrate 3 and separated by a field oxide layer 4. The transistors have respective source areas 20, 21 and drain areas 22, 23 doped with n-type materials, such as phosphorous or arsenic, and conductive gates T1, T2 made of metals or polysilicon as is well known in the art. A substrate channel 5 beneath the field oxide layer is doped with a p-type material, such as boron, to prevent carriers from moving between the two n-type regions. Conversely, the channel may be n-type and the drains and sources p-type. If a voltage in excess of a threshold voltage is applied to the field oxide layer, inversion of the p-type channel occurs and carriers travel through the channel. This condition is commonly known as isolation breakdown.

FIG. 2 illustrates a detailed view of a preferred isolation area "A" of FIG. 1 designed in accordance the invention. Layers 4 and 5 represent a field oxide layer and a channel substrate, respectively, of an integrated circuit. A BPSG dielectric layer 6 is deposited on the field oxide layer 4 to buffer the transistor gates (e.g., T1 and T2) from metal conductor traces 7 formed with at least one metallization layer. The traces 7 interconnect various devices formed in the integrated circuit.

On top of the metal conductor trace 7 is an intermetal oxide sandwich comprising a lower oxide layer 8, SOG layer 9 and an upper oxide layer 10. This sandwich oxide layer isolates the traces of the first metallization level (i.e., trace 7) from traces of a second metallization level (trace 12). Each additional metallization layer would be separated by an intermetal oxide sandwich which electrically isolates one metallization layer from the next. After all of the metallization and intermetal oxide layers have been formed, a nitride passivation layer 13 is deposited on the uppermost oxide layer (i.e., oxide layer 11 in FIG. 2) to protect the IC from the environment.

According to a preferred embodiment, an amorphous silicon layer 14 is formed by plasma deposition between the lower oxide layer 8 and the SOG layer 9 of the intermetal oxide sandwich. This amorphous silicon layer may be relatively thin, on the order of 500–1000 angstroms, due to the high concentration of dangling silicon bonds in amorphous silicon. The dangling silicon bonds bordering the dielectric neutralize charge introduced in the SOG layer which would typically cause inversion of the channel substrate.

Other preferred embodiments can be used to neutralize charge built up in the SOG layer. For example, rather than providing a single layer of amorphous silicon under the SOG layer, one layer may be provided on top of the SOG layer (i.e., amorphous silicon layer 14a) and another beneath the SOG layer (layer 14). These two layers of amorphous silicon may be thinner than the single layer provided in the above-mentioned embodiment. For example, each of the two amorphous silicon layers can be approximately 500 angstroms.

Preferred embodiments of the present invention are not limited to the neutralization of charges created by interaction between the nitride passivation layer and the SOG layer, nor to charges impressed upon the SOG layer. It has been determined that charges can be impressed upon any of the dielectric layers in an integrated circuit package by a plurality of different mechanisms. For example, glass defects can produce charges in the SOG layer even if the SOG is inorganic. Similarly, the high voltage plasma deposition of certain dielectric layers may induce charges therein. The aforementioned preferred embodiments will, however, neutralize the charges.

Another preferred embodiment of a multilayer integrated circuit according to the invention includes an amorphous silicon layer 15 beneath the BPSG layer 6 to neutralize any charge applied thereto. In the same manner mentioned with respect to the SOG layer above, the single amorphous silicon layer beneath the BPSG layer can be replaced with two such layers (i.e., layers 15 and 15a) sandwiching the BPSG layer as described previously.

It will be appreciated by those skilled in the art that the present invention can be embodied in other specific forms without departing from the spirit or essential characteristics thereof. Although the present invention is described above in the context of a particular integrated circuit structure, those skilled in the art will recognize its applicability in suppressing undesirable charges in other semiconductor structures.

The presently disclosed embodiments are therefore considered in all respects to be illustrative not restrictive. The scope of the invention is indicated by the appended claims rather than the foregoing description, and all changes that come within the meaning and range of equivalents thereof are intended to be embraced therein.

What is claimed is:

1. An integrated circuit comprising:
    a substrate;
    a plurality of electrical devices formed on said substrate;
    isolation means provided between each of said electrical devices;
    at least one metallization layer for interconnecting the electrical devices;
    a first dielectric layer located adjacent said metallization layer;
    a first layer of amorphous silicon formed on at least a first side of said first dielectric layer between said at least one metallization layer and said first dielectric layer; and
    another layer of amorphous silicon formed on a second side of said first dielectric layer opposite said first side.

2. An integrated circuit comprising:
    a substrate;
    a plurality of electrical devices formed on said substrate;
    isolation means provided between each of said electrical devices;
    at least one metallization layer for interconnecting the electrical devices;

a first dielectric layer located adjacent said metallization layer;

a layer of amorphous silicon formed on at least a first side of said first dielectric layer between said at least one metallization layer and said first dielectric layer; and an intermetal oxide sandwich which includes upper and lower oxide layers, said first dielectric layer being a spin-on-glass layer located between said upper and lower oxide layers.

3. An integrated circuit comprising:

a substrate;

a plurality of electrical devices formed on said substrate;

isolation means provided between each of said electrical devices;

at least one metallization layer for interconnecting the electrical devices;

a first dielectric layer located adjacent said metallization layer; and a layer of amorphous silicon formed on at least a first side of said first dielectric layer between said at least one metallization layer and said first dielectric layer, wherein said first dielectric is a BPSG layer formed on said isolation means between said isolation means and said at least one metallization layer.

4. An integrated circuit according to claim 2 further comprising:

another layer of amorphous silicon formed on a second side of said first dielectric layer opposite said first side.

5. An integrated circuit according to claim 3 further comprising:

another layer of amorphous silicon formed on a second side of said BPSG layer opposite said first side.

6. An integrated circuit according to claim 3 further comprising:

another layer of amorphous silicon formed on a second side of said BPSG layer between said isolation means and said BPSG layer.

7. An integrated circuit according to claim 6 further comprising:

a second dielectric layer located adjacent said at least one metallization layer; and a third layer of amorphous silicon formed on said first side of said BPSG layer, said third layer of amorphous silicon being formed between said second dielectric layer and said at least one metallization layer.

8. An integrated circuit comprising:

a substrate;

a plurality of electrical devices formed on said substrate;

isolation means provided between each of said electrical devices;

at least one metallization layer for interconnecting the electrical devices;

a first dielectric layer located adjacent said metallization layer; and a layer of amorphous silicon formed on said isolation means and being located on at least one side of said first dielectric layer between said first dielectric layer and said isolation means, wherein said first dielectric is a BPSG layer located between said isolation means and said at least one metallization layer.

9. An integrated circuit according to claim 8 further comprising:

another layer of amorphous silicon formed on another side of said BPSG layer opposite said one side, said another layer being formed between said BPSG layer and said at least one metallization layer.

10. An integrated circuit according to claim 1 further comprising:

a nitride passivation layer, said first layer of amorphous silicon neutralizing charges created in said first dielectric layer due to a reaction of said nitride passivation layer with said first dielectric layer.

11. An integrated circuit according to claim 1 wherein said first dielectric layer is formed of an organic material.

12. An integrated circuit according to claim 11 wherein said organic material is a spin-on-glass layer.

13. An integrated circuit according to claim 10 wherein said first dielectric layer is a spin-on-glass layer.

14. An integrated circuit according to claim 10 wherein said first dielectric layer is a BPSG layer.

15. An integrated circuit according to claim 2 further comprising:

a nitride passivation layer, said layer of amorphous silicon neutralizing charges created in said first dielectric layer due to a reaction of said nitride passivation layer with said dielectric layer.

16. An integrated circuit according to claim 3 further comprising:

a nitride passivation layer, said layer of amorphous silicon neutralizing charges created in said first dielectric layer due to a reaction of said nitride passivation layer with said dielectric layer.

17. An integrated circuit according to claim 8, further comprising:

a nitride passivation layer, said layer of amorphous silicon neutralizing charges created by said nitride passivation layer.

* * * * *